United States Patent
Cho et al.

(10) Patent No.: US 7,317,480 B1
(45) Date of Patent: Jan. 8, 2008

(54) IMAGING APPARATUS PROVIDING BLACK LEVEL COMPENSATION OF A SUCCESSIVE APPROXIMATION A/D CONVERTER

(75) Inventors: Kwang-Bo Cho, Los Angeles, CA (US); Michael Kaplinsky, Sierra Madre, CA (US); Sandor L. Barna, Pasadena, CA (US); Zeynep Toros, Irvine, CA (US); Igor Subbotin, S. Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 1016 days.

(21) Appl. No.: 10/000,660

(22) Filed: Oct. 30, 2001

Related U.S. Application Data

(60) Provisional application No. 60/254,328, filed on Dec. 7, 2000, provisional application No. 60/244,412, filed on Oct. 30, 2000.

(51) Int. Cl.
*H04N 5/217* (2006.01)
*H04N 9/64* (2006.01)
*H03M 1/12* (2006.01)

(52) U.S. Cl. .................. 348/243; 348/241; 341/172
(58) Field of Classification Search .............. 348/243; 341/126, 165, 155, 172; 340/870.21
See application file for complete search history.

(56) References Cited

U.S. PATENT DOCUMENTS

| | | | | |
|---|---|---|---|---|
| 4,811,016 A | * | 3/1989 | Millward et al. | 341/126 |
| 5,027,148 A | * | 6/1991 | Anagnostopoulos | 396/96 |
| 5,105,276 A | * | 4/1992 | Schrock | 348/241 |
| 5,111,311 A | * | 5/1992 | Yamamoto | 358/461 |
| 5,329,111 A | * | 7/1994 | Sonoda et al. | 250/208.1 |
| 5,408,335 A | * | 4/1995 | Takahashi et al. | 358/443 |
| 5,654,755 A | * | 8/1997 | Hosier | 348/245 |
| 5,659,355 A | * | 8/1997 | Barron et al. | 348/245 |
| 6,304,292 B1 | * | 10/2001 | Ide et al. | 348/243 |
| 6,476,751 B1 | * | 11/2002 | Krymski et al. | 341/155 |
| 6,507,365 B1 | * | 1/2003 | Nakamura et al. | 348/296 |
| 6,737,654 B2 | * | 5/2004 | Ducourant | 250/370.11 |
| 6,774,942 B1 | * | 8/2004 | Salcedo et al. | 348/243 |
| 6,806,901 B1 | * | 10/2004 | Mukherjee et al. | 348/243 |
| 6,829,007 B1 | * | 12/2004 | Bilhan et al. | 348/243 |

FOREIGN PATENT DOCUMENTS

JP 04322575 A * 11/1992
JP 11196335 A * 7/1999

* cited by examiner

*Primary Examiner*—Lin Ye
*Assistant Examiner*—Kelly Jerabek
(74) *Attorney, Agent, or Firm*—Dickstein Shapiro LLP

(57) ABSTRACT

Image sensor with a successive approximation A/D converter that automatically compensates for black level and provides a signal indicative of the difference between the reset level and the signal level. Black level for each of a plurality of color pixels may be obtained. This may be obtained from, for example, an image sensor with intentionally darkened pixels. Levels from these pixels are sampled, and an average of these pixels is used to form a black level for similarly-colored pixels. That black level is stored, and used to drive a D/A converter. Another D/A converter forms the actual conversion, and is compared to a reference. The reference is selected such that the output signal is automatically compensated for black level, and also corresponds to the difference between signal and reset.

34 Claims, 3 Drawing Sheets

2

IMAGING APPARATUS PROVIDING BLACK LEVEL COMPENSATION OF A SUCCESSIVE APPROXIMATION A/D CONVERTER

CROSS-REFERENCE TO RELATED APPLICATIONS

The present application claims priority from provisional application No. 60/244,412, filed Oct. 30, 2000 and application No. 60/254,328, filed Dec. 7, 2000.

BACKGROUND

Image sensors often operate by acquiring a signal in pixels, each pixel producing a value indicative of the amount of light impinging on the pixel. That value is usually an analog value, but modern image sensors often output digital versions of the analog value. This necessitates use of an analog to digital converter to convert the analog signal to digital.

A common type of A/D converter is a successive approximation type A/D converter.

It is often also desired to carry out black level compensation in such an image sensor to reduce the noise and increase the dynamic range. Black level compensation can be done using digital signal processing, or analog signal processing. Each may have its own drawbacks. Digital signal processing may sacrifice the upper dynamic range of the signal. Analog signal processing may require an additional D/A converter.

SUMMARY

The present application describes black level compensation techniques using a successive approximation A/D converter that carries out the black level compensation as part of the conversion.

BRIEF DESCRIPTION OF THE DRAWINGS

These and other aspects will now be described in detail with reference to the accompanying drawings, wherein.

DETAILED DESCRIPTION

Figure 1:
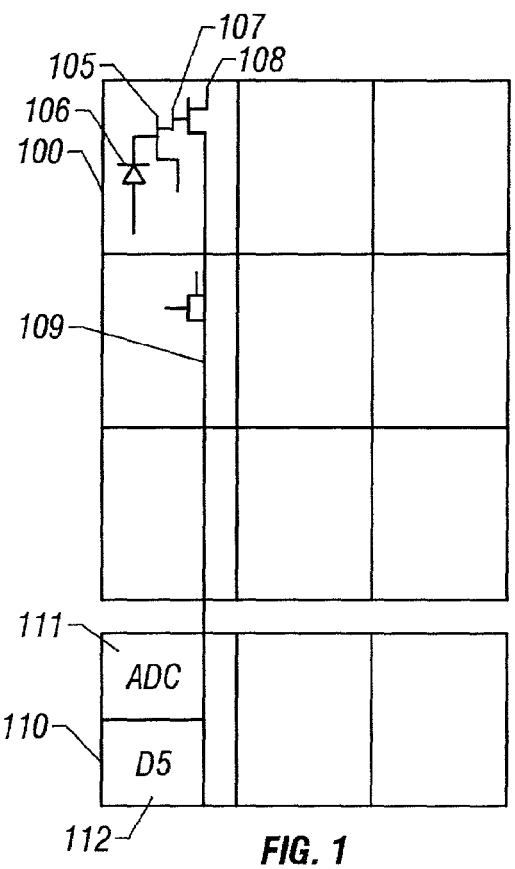
FIG. 1 shows a basic block diagram of an image sensor of the present system.

FIG. 1 shows a basic image sensor formed of a photosensor array 100, and a signal processing part 110. Each pixel such as 105 may include a photosensor 106, which may be for example a photodiode. An in-pixel follower 107 buffers the signal from the photosensor 106. An in pixel selection transistor 108 selects the output of the specific pixel at any specific time. Other circuitry, preferably CMOS circuitry, may also be formed within the pixel. The selection of the given pixel causes its output to be transferred on the common output line 109 to an appropriate block of the signal processing element 110. The signal processing element 110 may include, for example, an A/D converter 111, and a double sampling circuit 112.

Figure 2:
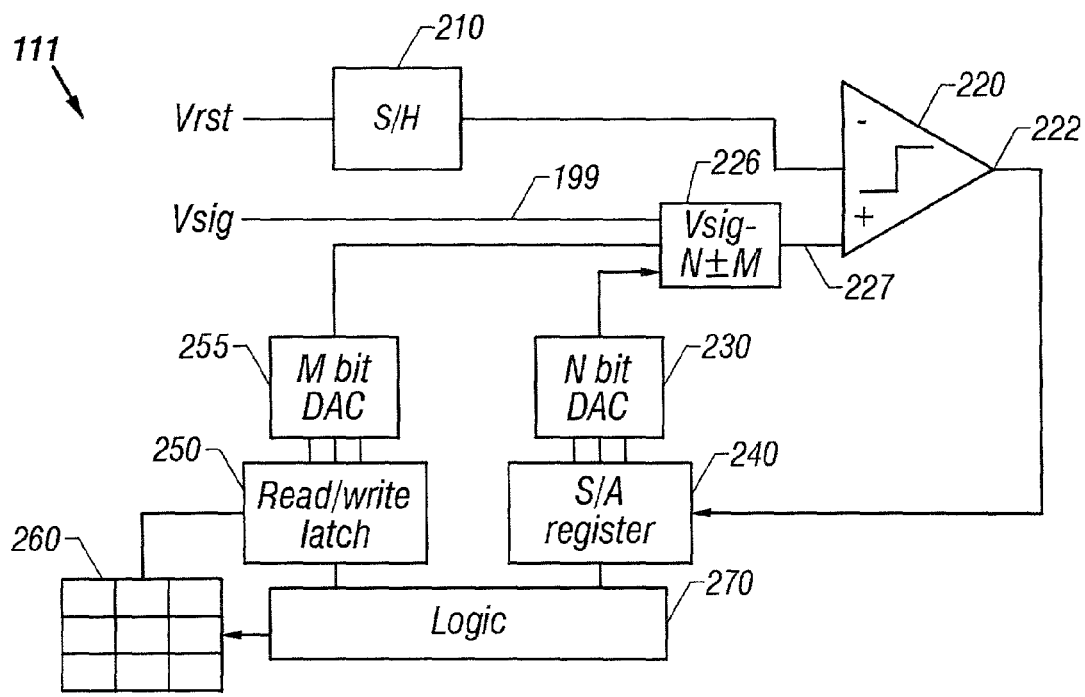
FIG. 2 shows a block diagram of the successive approximation A/D converter with black level compensation.

The A/D converter circuit 111 is shown in further detail in FIG. 2. In this embodiment, the A/D converter is a successive approximation type A/D converter. This system uses a binary search through quantization levels prior to converging on the final digital answer, as conventional.

A timing control logic 270, which may be a processor, for example, controls the timing of the conversion. In this embodiment, the conversion is N-bits, where N represents the total resolution of the A/D converter. The system also uses a second, M bit D/A converter, where M<N, for compensation of black level of the image. In operation, the N bit D/A converter 230 operates in conjunction with the M bit D/A converter 255 in a way such that the conversion automatically takes into account compensation for black level of the image.

The desired end result is to obtain a digital output signal representing the value of the difference between reset and signal, as compensated for black level. A reset voltage, representing the level of reset, is held in a sample and hold unit 210. As explained above, this feeds one input of the comparator 220.

The signal value 199 represents the desired signal to be converted. This value is added to (or subtracted from, depending on sense) the output of the N bit DAC 230 which represents the digitized signal value. Since the photodiode collects negatively charged electrons, the signal voltage is lower than the reset voltage. The value being digitized, therefore, represents (reset-signal). This is also added to the output of the M bit DAC 255, which represents the black level. The output signal from adder 226 is shown as signal 227, and this represents the value $Vsig-V_N+/-V_M$, where $V_N$ is the output of the N bit DAC, and $V_M$ is the output of the M bit DAC 255.

The comparator flips when the value input at 227 exceeds the reset level. The register either counts up or counts down, in conventional successive approximation fashion, based on the control input 222.

The successive approximation device attempts to determine the A/D value iteratively, by changing the value to match the guess. The comparator indicates whether the "guess" in the register is too high or too low. The register starts with Vsig+/−Vm, then flips the most significant bit of the N bit dac, changing Vn from 0 to (½)*Vref, and then checks at the output of the comparator. If the comparator flips, the value has gone too high and the bit is flipped back to 0. If not, it is kept at (½)*Vref. Then, the next bit is flipped to add (¼)*Vref to the previous value. This will give either (¼)*Vref (if the last time the value went too high) or (¾)*Vref (if the last time the value did not go too high it didn't). The output of the comparator is used to determine whether or not to keep this new value. This process is repeated until all 8 bits have been determined. Therefore, when the value output from the successive approximation register 240 settles, the digital output value then represents a value of signal, compensated for black level, and compensated for the reset.

The M bit D/A converter 255 is associated with a read/write latch 250 which stores a calibration level representing a black level of the output. The black level calibration may be fewer bits then from the total conversion. For example, if N is 8, M may be four or five.

A separate read/write latch 250 may be used to store black level calibration results.

Figure 3:
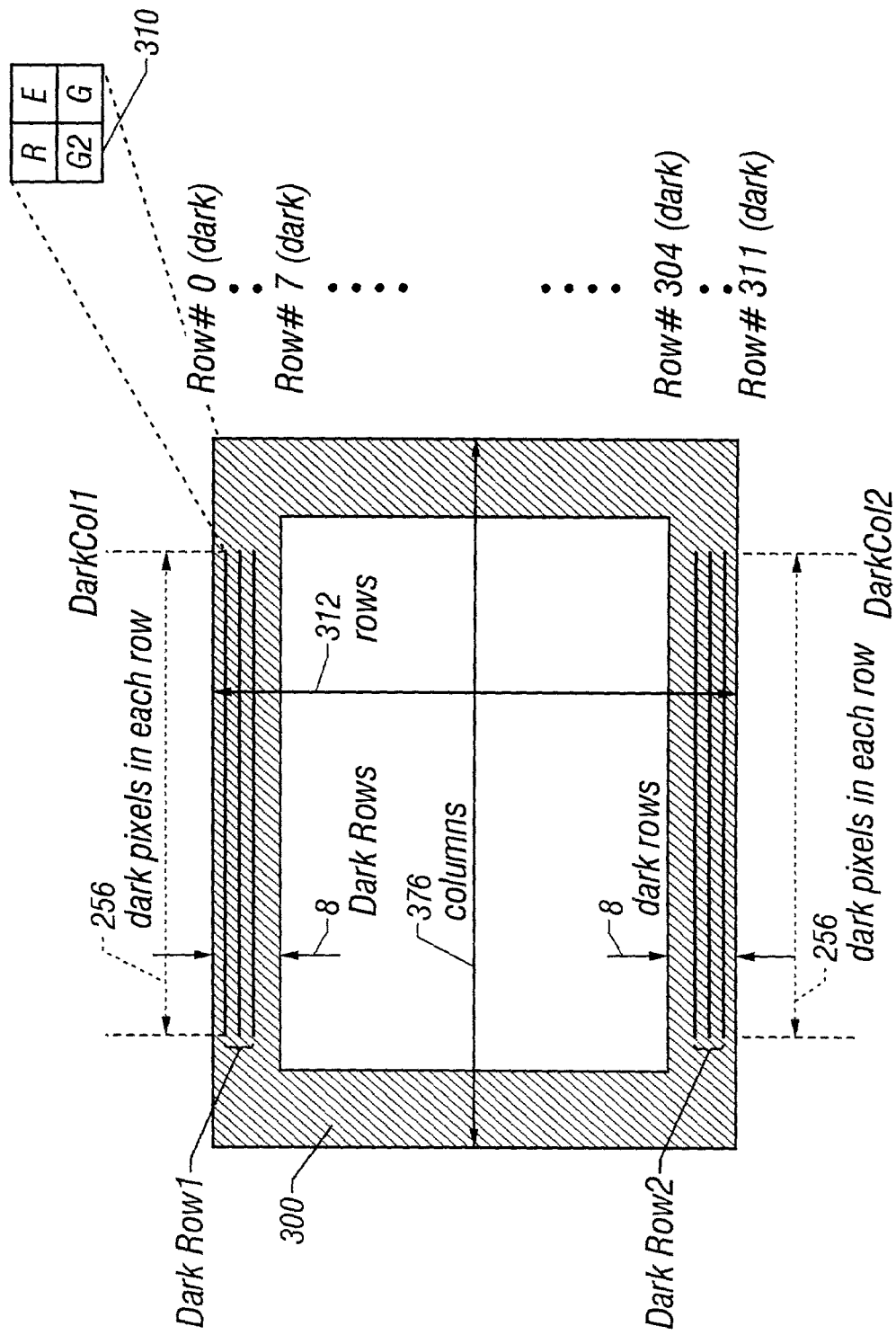
FIG. 3 shows a specified pixel structure of the pixel with intentionally darkened pixels.

In the specific product described, the pixel structure may have the general layout shown in FIG. 3. Specifically, there may be a special section of the pixel used for calibration. The overall extent of the structure has 312 rows by 376 columns as shown. However, some number of these pixels may be dark, and used for calibration. In this embodiment, the entire outer frame of the image sensor may represent dark pixels. Rows 0-37 and 304-311 (the top and bottom eight rows) may represent dark pixels which are, for example, blocked by a metal shield. The initial parts of the columns, for example the initial 60 pixels of each column and the last 60 pixels of each column may also be dark. As conventional in a color image sensor, the pixels are arranged into a series of repeating rectangular shaped units 310 shown in the inset. Each pixel is associated with a specified color. Therefore, the dark pixels may have their values characterized according to this color.

This calibration section 300 may be used to obtain values that are used to correct for black level. An array of registers 260 may be used to store certain dark pixel data. For example, the last incoming dark pixel data for each of a plurality of colors may be stored.

In an embodiment, an array of five registers×3 colors is represented by the register 260. Incoming data is segregated by the color and by dark pixel. Each dark pixel data in the registers is represented as data1, data2, data3, data4, data5, for each of the three colors.

The data is also processed. This may be done using the on board logic 270. For example, the data may be processed to remove data that is outside a specified median value.

The average value of the selected dark pixels for each color is then calculated. This may be a local calculation, based on an old calculation, or may be as shown herein, a weighted average of previous values and current values. For example, the average value may be calculated as:

$$\text{New\_av} = \frac{2^n - 1}{2^n}(\text{old\_ave}) + \frac{1}{2^n}(\text{current\_ave})$$

where n is the number of frames over which the value can be determined. N may be programmable.

Figure 4:
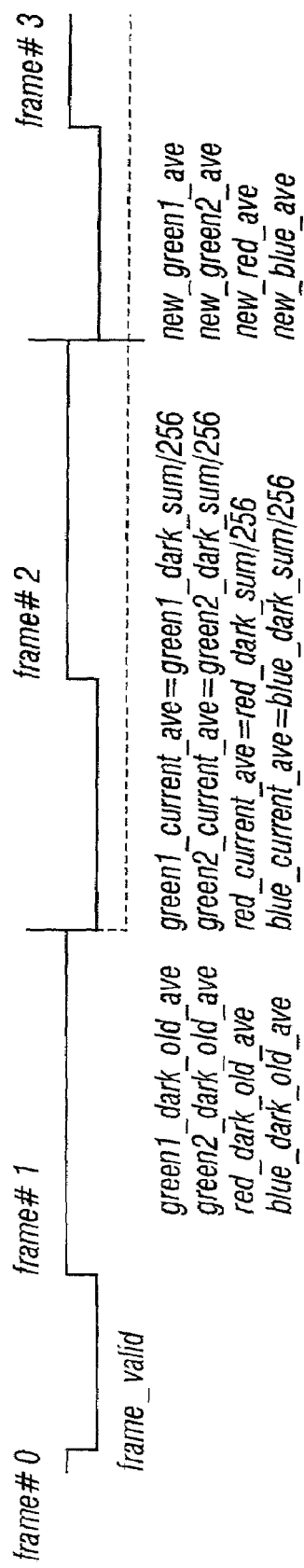
FIG. 4 shows a system of frame averaging.

The operation of frame averaging is shown in FIG. 4. Frame averaging may start at the end of frame number 2 for example. An average of the different frames may be calculated using the some value during frame number two, as shown in FIG. 4. The values and the different frames are stored. For example, values for frame three may be calculated using currently stored new values for dark current. The current values may be stored as new green 1 average, new green 2 average, new red average, new blue average. These are obtained from the current frame number 3, where the value of green 1 current average green 1 dark sum/256.

Analogously, the same values may be obtained for green 2, red and blue.

The old average is the average for the previous frame, and may be stored as green 1, green 2, red and blue.

The calculated average may then be used for A/D converter calibration. The user may override previously obtained average values and define difference values to add to or subtract from the average value at each frame.

Although only a few embodiments have been disclosed in detail above, other modifications are possible. For example, while the above has described different types of it adding and subtracting, it should be understood that the opposite senses should also be included. Moreover, while the above has described that the pixel value has the dark level added or subtract it, it should be understood that the reference value (the reset) could alternatively have the dark level used as its compensating factor.

All such modifications are intended to be encompassed within the following claims, in which.

What is claimed is:

1. An image sensor assembly, comprising:
   an array of photoreceptors, each receiving image energy from a pixel of an overall image;
   a dark level storage register, storing information indicative of a dark level in a pixel; and
   an A/D converter, which converts energy from said photoreceptors into a digital form while separately converting the information stored in the dark level storage register into a voltage level indicative of said dark level, and combining said voltage level indicative of said dark level with said energy from said photoreceptors, said digital form being indicative of the energy as compensated by said information indicative of said dark level; and
   a dark level determining element, determining levels of known dark elements within said array of photoreceptors, and determining an average of said levels and storing said average in said dark level storage register.

2. An image sensor as in claim 1, wherein said dark level determining element determines said levels for each of a plurality of frames.

3. An image sensor as in claim 2, wherein said dark level determining element determines said levels as:

$$\text{New\_av} = \frac{2n - 1}{2n}(\text{old\_ave}) + \frac{1}{2n}(\text{current\_ave})$$

4. An image sensor assembly comprising:
   an array of photoreceptors, each receiving image energy from a pixel of an overall image;
   a dark level storage register, storing information indicative of a dark level in a pixel; and
   an A/D converter, which converts energy from said photoreceptors into a digital form while separately converting the information stored in the dark level storage register into a voltage level indicative of said dark level, and combining said voltage level indicative of said dark level with said energy from said photoreceptors, said digital form being indicative of the energy as compensated by said information indicative of said dark level; and
   wherein said A/D converter includes a first part which converts a signal, and a second part which converts the level indicative of said dark level.

5. An image sensor as in claim 4, wherein said A/D converter converts a level equivalent to a difference between a reset level and signal level.

6. An image sensor as in claim 4, wherein said first part converts with a greater bit resolution than said second part.

7. An image sensor as in claim 6, wherein outputs of said first part and said second part are added together.

8. An image sensor as in claim 4, further comprising a successive approximation register, driving said first part to produce an output, and a comparator, comparing said output to a signal output.

9. An image sensor assembly, comprising:
   an array of photoreceptors, each receiving image energy from a pixel of an overall image;
   a dark level storage register, storing information indicative of a dark level in a pixel; and
   an A/D converter, which converts energy from said photoreceptors into a digital form while separately converting the information stored in the dark level storage register into a voltage level indicative of said dark level, and combining said voltage level indicative of said dark level with said energy from said photoreceptors, said digital form being indicative of the energy as compensated by said information indicative of said dark level, wherein said array of photoreceptors includes at least a plurality of dark photoreceptors which are intentionally maintained in a dark state, said plurality of dark photoreceptors being used as a calibration region; and a register, storing a plurality of values of said dark photoreceptors for each of a plurality of colors.

10. An image sensor as in claim 9, further comprising a processing element, which calculates an average value of a plurality of dark photoreceptors.

11. An image sensor as in claim 10, wherein said average value is calculated as a weighted average between a currently obtained average and a previously obtained average.

12. An image sensor as in claim 11, wherein said currently obtained average is an average for a current frame, and said previously obtained average is an average for a previous frame.

13. A method, comprising:
obtaining analog values indicative of image signals;
storing dark level values, representing levels of dark signals; and
converting said analog values to digital values while separately converting the stored dark levels into voltage levels indicative of said dark level values and combining said voltage levels indicative of said dark level values with said analog values as part of creating digital values that are indicative of the image signals as compensated for said dark level values,
wherein said converting comprises comparing compensated analog values to a reference, wherein said compensated analog values correspond to a combination of said analog values from said image signals and analog values representative of said dark level values.

14. A method as in claim 13, further comprising obtaining dark level values.

15. A method as in claim 14, wherein said obtaining dark level values comprises obtaining values from intentionally-darkened pixels.

16. A method as in claim 15, wherein said obtaining values comprises obtaining an average value of a plurality of said pixels.

17. A method as in claim 16, wherein said average value is obtained for each of a plurality of colors of pixels.

18. A method as in claim 16, wherein said obtaining values comprises finding a weighted average between a currently obtained average for a current frame, and a previous average for at least one previous frame.

19. A method as in claim 13, wherein said converting further comprises comparing said compensated analog values to a reference based on a reset level, to obtain an output digital value based on the difference between a signal value and the reset level.

20. A method, comprising:
obtaining analog values indicative of image signals;
storing dark level values, representing levels of dark signals; and
converting said analog values to digital values while separately converting the stored dark levels into voltage levels indicative of said dark level values and combining said voltage levels indicative of said dark level values with said analog values as part of creating digital values that are indicative of the image signals as compensated for said dark level values, wherein said storing dark level values comprises storing dark level values for each of a plurality of colors, and said converting converts the analog value while compensating for the dark level value for the corresponding colors signal.

21. An image sensor, comprising:
an array of pixels, including a plurality of dark pixels, and a plurality of image sensing pixels that sense image content;
a register, storing information from said plurality of dark pixels; and
a successive approximation A/D converter, including a register storing a current digital conversion value, a comparator, and at least first and second D/A converters, a first of said D/A converters producing an output indicative of information from said plurality of dark pixels, and a second of said D/A converters producing an output indicative of information from the current digital conversion value.

22. An image sensor as in claim 21, wherein said comparator receives a combination of analog values from said first and second D/A converters.

23. An image sensor as in claim 22, wherein said comparator compares said combination to a reference that results in an output equivalent to signal minus reset.

24. An image sensor, comprising:
an array of pixels, including a plurality of darkened pixels which are darkened to produce an output indicative of black level, and a plurality of image sensing pixels that sense image content;
a register, storing information from said dark pixels; and
a calculation element, which determines a black level to be used for compensation by averaging values in said register, said values generated from both a current frame and a previous frame,
wherein said calculation element determines a weighted sum of values from said current frame and a previous frame.

25. An image sensor, comprising:
an array of pixels, including a plurality of darkened pixels which are darkened to produce an output indicative of black level, and a plurality of image sensing pixels that sense image content;
a register, storing information from said dark pixels; and
a calculation element, which determines a black level to be used for compensation by averaging values in said register, said values generated from both a current frame and a previous frame,
wherein said plurality of darkened pixels forms a frame like edge around the plurality of undarkened pixels,
wherein said frame like edge is at least eight pixels around an entirety of said undarkened,
wherein said calculation element calculates different values for each of a plurality of pixel colors.

26. An image sensor as in claim 25, further comprising a register storing values related to dark levels.

27. An image sensor, comprising:
an array of pixels, including a plurality of darkened pixels which are darkened to produce an output indicative of black level, and a plurality of image sensing pixels that sense image content;
a register, storing information from said dark pixels;
a calculation element, which determines a black level to be used for compensation by averaging values in said register, said values generated from both a current frame and a previous frame, an analog to digital converter element, which converts said image content to a digital value while compensating for said black level.

28. An image sensor as in claim 27, wherein said analog to digital converter element is a successive approximation analog to digital converter, which operates to compare a value to be converted to a reference, and in which said compare comprises compensating for said black level.

29. An image sensor as in claim 28, wherein said compensating comprises adding or subtracting said black level from a value of said image content.

30. An image sensor, comprising:
an array of pixel-based photo sensors, including a first plurality of intentionally darkened pixel photo sensors, which are intentionally configured to be maintained dark, and configured to produce an output indicative of dark level, and a second plurality of image sensing pixels, that are configured to sense content of an incoming image, and produce an output indicative of pixels of said incoming image; and
an analog to digital converter configured to produce an output indicative of values produced by said image sensing pixels as compensated in said converter by values produced by said intentionally darkened pixel photo sensors for a plurality of frames,
wherein said analog to digital converter includes a register which stores values related to dark levels of said intentionally darkened photo sensors.

31. A sensor as in claim 30, wherein said register stores values of weighted averages of dark levels of different pixels.

32. A sensor as in claim 31, wherein said register stores dark levels for each of a plurality of colors.

33. A sensor as in claim 30, wherein said analog to digital converter is a successive approximation type analog to digital converter which compares a value to be converted with a reference value, and wherein one of said values is compensated using said dark level.

34. An image sensor, comprising:
an array of imaging pixels, each imaging pixel providing a reset signal and an image signal representing incident image light;
a register for storing data representing a black level signal; and
a successive approximation analog to digital circuit for using, for each pixel, a reset signal, an image signal, and a black level signal corresponding to said data and for providing a digital output signal representing the image signal as adjusted by said black level signal and a substractive combination of said adjusted image signal and said reset signal.

* * * * *